US011486857B2

(12) United States Patent
Gunawan et al.

(10) Patent No.: US 11,486,857 B2
(45) Date of Patent: *Nov. 1, 2022

(54) CARRIER-RESOLVED PHOTO-HALL SYSTEM AND METHOD

(71) Applicant: International Business Machines Corporation, Armonk, NY (US)

(72) Inventors: Oki Gunawan, Westwood, NJ (US); Wang Zhou, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/314,634

(22) Filed: May 7, 2021

(65) Prior Publication Data

US 2021/0262982 A1    Aug. 26, 2021

Related U.S. Application Data

(63) Continuation of application No. 16/382,937, filed on Apr. 12, 2019, now Pat. No. 11,041,827.

(51) Int. Cl.
*G01N 27/72* (2006.01)
*G01R 33/07* (2006.01)
*G01R 33/032* (2006.01)

(52) U.S. Cl.
CPC ........... *G01N 27/72* (2013.01); *G01R 33/032* (2013.01); *G01R 33/07* (2013.01)

(58) Field of Classification Search
CPC ..... G01N 27/72; G01R 33/07; G01R 31/2656
See application file for complete search history.

(56) References Cited

U.S. PATENT DOCUMENTS

| 6,526,372 | B1 * | 2/2003 | Orschel | ............. | G01R 31/2656 |
| | | | | | 356/418 |
| 7,919,762 | B2 | 4/2011 | Trupke et al. | | |

(Continued)

FOREIGN PATENT DOCUMENTS

| CN | 1971295 A | 5/2007 |
| CN | 103033734 A | 4/2013 |

(Continued)

OTHER PUBLICATIONS

International Search Report and Written Opinion received for PCT Application Serial No. PCT/IB2020/052428 dated Jul. 10, 2020, 10 pages.

(Continued)

*Primary Examiner* — Christopher E Mahoney
(74) *Attorney, Agent, or Firm* — Amin, Turocy & Watson, LLP

(57) ABSTRACT

Systems and methods are provided that facilitate high-sensitivity, carrier-resolved photo-Hall effect measurements. Majority and minority carrier properties can be measured and determined simultaneously. In one aspect, a system and method determine majority carrier type, density and mobility and, with modulated illumination, minority carrier mobility and photocarrier density. In another aspect, a system and (Continued)

method can determine hole and electron mobility, photocarrier density, absorbed photon density, recombination lifetime and diffusion length for hole, electron and ambipolar transport.

20 Claims, 10 Drawing Sheets

(56) References Cited

U.S. PATENT DOCUMENTS

| | | | |
|---|---|---|---|
| 8,797,058 | B2 | 8/2014 | Gunawan et al. |
| 8,896,338 | B2 | 11/2014 | Kamieniecki |
| 9,041,389 | B2 | 5/2015 | Gokmen et al. |
| 9,366,719 | B2 | 6/2016 | Pfaff |
| 9,689,935 | B2 | 6/2017 | Lin et al. |
| 9,772,385 | B2 | 9/2017 | Gunawan et al. |
| 10,197,640 | B2 | 2/2019 | Gunawan et al. |
| 11,041,827 | B2 * | 6/2021 | Gunawan ............... G01N 27/72 |
| 2002/0175679 | A1 | 11/2002 | Kim et al. |
| 2018/0095147 | A1 | 4/2018 | Gunawan |
| 2020/0072915 | A1 | 3/2020 | Zhou et al. |

FOREIGN PATENT DOCUMENTS

| | | |
|---|---|---|
| CN | 108267661 A | 7/2018 |
| CN | 207799015 U | 8/2018 |
| JP | 2016157931 A | 9/2016 |
| WO | 02/090922 A2 | 11/2002 |

OTHER PUBLICATIONS

Ex Parte Quayle Action for U.S. Appl. No. 16/382,937 dated Dec. 24, 2020, 11 pages.
Non-Final Office Action for U.S. Appl. No. 16/382,937 dated Oct. 5, 2020, 16 pages.
Lee et al., "Atomically thin p-n junctions with van der Waals heterointerfaces," 29 pages.
Gunawan et al., "Carrier-Resolved Photo Hall Measurement in World-Record-Quality Perovskite and Kesterite Solar Absorbers," https://arxiv.org/abs/1802.07910, 2018, 28 pages.
Mak et al., "The valley Hall effect in MoS2 transistors," Science Magazine, vol. 344, Issue 6191, Jun. 27, 2014, 5 pages.
Hall, "On a New Action of the Magnet on Electric Currents," American Journal of Mathematics, vol. 2, No. 3, Sep. 1879, pp. 287-292, 7 pages.
Gunawan et al., "A Parallel Dipole Line System," Appl. Phys. Lett. 106, Jan. 29, 2015, 9 pages.
"Hall Effect," https://en.wikipedia.org/wiki/Hall_effect, 11 pages.
Schroder, "Semiconductor Material and Device Characterization," IEEE Press, John Wiley & Sons, 2006, 790 pages.
List of IBM Patents or Applications Treated as Related.
Office Action received for GB Patent Application Serial No. 2115227.7 dated Nov. 16, 2021, 3 pages.

* cited by examiner

CARRIER-RESOLVED PHOTO-HALL SYSTEM AND METHOD

BACKGROUND

The subject disclosure relates to relates to Hall effect measurement, and more particularly, to a carrier-resolved photo-Hall system utilizing AC field Hall system such as using the parallel dipole line Hall system.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later.

According to one embodiment, a measurement system is provided. The measurement system can comprise a measurement chamber and an optics module coupled to the measurement chamber. The optics module can also comprise a light source and a filter that modulates light from the light source and illuminates a sample under test with modulated light from the light source. The system can further comprise a Hall measurement module that outputs one or more Hall measurements that indicate a first carrier mobility and a second carrier mobility and the photocarrier density of the sample under test based on the modulated light.

According to another embodiment, a method is provided. The method can comprise illuminating a sample under test provided in a measurement chamber. The method can further comprise modulating the illumination of the sample under test. The method can comprise measuring Hall measurements of the sample under test based on the modulated illumination of the sample under test. The method can further comprise determining a first or majority carrier mobility and a second or minority carrier mobility in the sample under test based on the Hall measurements and the modulated illumination.

According to another embodiment, a computer product that facilitates Hall measurements is provided. The computer program product can comprise a computer readable storage medium having program instructions embodied therewith, the program instructions are executable by a processor. The program instructions can cause the processor to illuminate a sample under test provided in a measurement chamber and modulate the illumination of the sample under test. The program instructions can further cause the processor to measure Hall measurements of the sample under test based on the modulated illumination of the sample under test. The program instructions can cause the processor to determine a first carrier mobility and a second carrier mobility and the photocarrier density in the sample under test based on the Hall measurements and the modulated illumination

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Notwithstanding the relative differences in dimensions between the examples shown in the figures used to describe the above concepts, it should be noted that FIGS. 1-10, referenced by this description, are not intended to be drawn to scale, and should not be relied upon in this respect.

The embodiments herein relate to a carrier-resolved photo-Hall system utilizing an AC field Hall system, such as AC electromagnet, or rotating parallel dipole line (PDL) magnet system and a measurement chamber or cryostat system. The system can calculate various semiconductor parameters of both majority and minority carriers, such as mobility, photocarrier density, recombination lifetime and recombination coefficients. In one or more embodiments, the system can employ a photo-Hall data analysis technique to simultaneously determine various parameters of a semiconductor material, such as majority and minority carrier type, mobility and density, and carrier recombination lifetime.

Majority and minority carrier properties in semiconductor, such as, type, density and mobility are parameters that govern the operations of devices, such as optoelectronic devices and solar cells. The measurement of these parameters was previously very difficult and insufficient. In one or more embodiments, using carrier-resolved Photo Hall technique, a system can measure these parameters simultaneously under modulated illumination of the sample-under-test and determine parameters such as recombination lifetime, diffusion length and recombination coefficient.

In addition, in one or more embodiments, an AC field Hall measurement technique can be used to extract a clean Hall signal using parallel dipole line Hall system. As described further herein, the system can comprise a dipole line magnet that is a cylindrical magnet with transverse magnetization to produce a magnetic field equal to a linear distribution of transverse dipole. The system can utilize one or multiple PDL magnets to perform the photo-Hall measurement.

Figure 1:
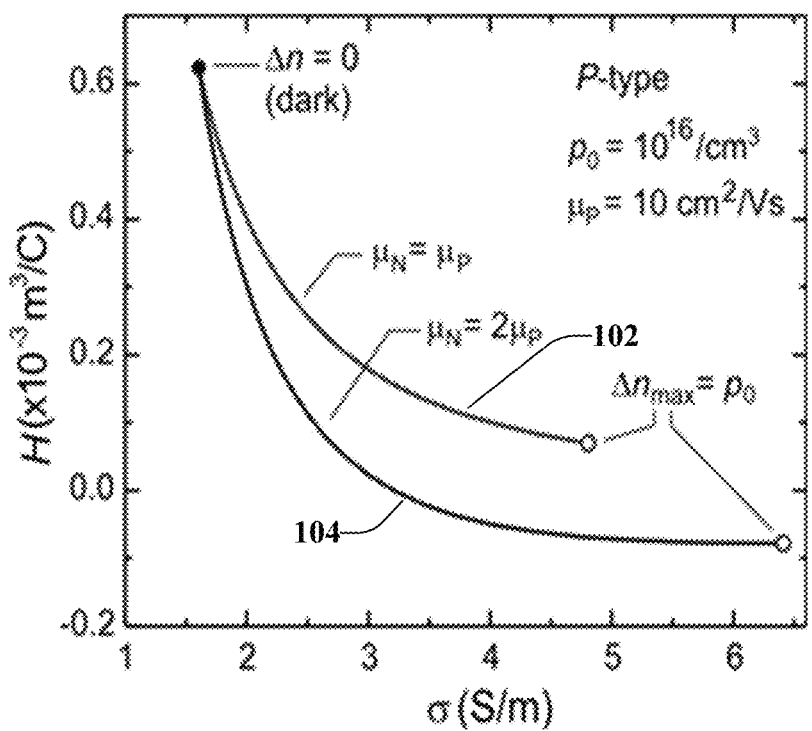
FIG. 1 illustrates an example, non-limiting, conductivity ($\sigma$) versus Hall coefficient (H) plot for two samples with different minority carrier mobility, illuminated by modulated light in accordance with one or more embodiments described herein.

FIG. 1 illustrates an example, non-limiting, conductivity (σ) versus Hall coefficient (H) plot for two samples with different minority carrier mobility, illuminated by modulated light in accordance with one or more embodiments described herein. As shown, curves 102 and 104 illustrate two samples of p-type material having the same majority mobility but different minority carrier mobility, and thus, will exhibit different Hall coefficient (H) versus conductivity (σ) characteristics over a range of illumination (e.g., from dark to bright illumination). This phenomenon enables the Photo Hall technique of one or more of the embodiments to be carrier-resolved to identify characteristics of both the majority carriers and the minority carriers.

For example, the two p-type semiconductor samples exhibit a majority carrier density ($p_0$) and mobility ($\mu_P$), but with different minority mobility ($\mu_N$) illustrated by curves 102 and 104. In one example, from the dark or under no illumination, both samples can start from the same point if they have the same conductivity (σ) and Hall coefficient (H). However, due to the difference in minority carrier mobility, when these samples are illuminated to a certain maximum photocarrier density $\Delta n_{max}$, both samples will trace a different σ-H curve (e.g., curve 102 versus 104). This effect occurs due to the increasing role of the minority carrier to the total conductivity under illumination, even though they start from the same point in the dark. In one or more embodiments, the trajectory of the σ-H curve is used to determine and calculate information about the minority carrier. For example, the slope (dH/dσ) at any given point along either curve 102 or 104 can be used to determine or calculate the majority and minority carrier information.

Under illumination, in a semiconductor material, the photogeneration effect produces excess majority and minority carriers. The transport property of these carriers can be described by electrical conductivity: $\sigma=(e(p\mu_P+n\mu_N))$ and Hall coefficient:

$$H = \frac{r(p - \beta^2 n)}{(p + \beta n)^2 e},$$

where e is electron's charge, p is the total hole carrier density, n is the total electron density, r is the Hall scattering factor, $\mu_P$ is the hole mobility, $\mu_N$ is the electron mobility and $\beta=\mu_N/\mu_P$ is the ratio of the minority and majority carrier. The total hole density can be given as: $p=p_0+\Delta p$, and $n=n_0+\Delta n$. In one example, for a n-type material, $n_0$ is small, and thus, $n=\Delta n$. Accordingly, in one or more embodiments, measurements of σ, H and the slope dH/dσ can be used to solve for $\mu_P$, $\mu_N$ and $\Delta n$ at every light intensity.

In a photo-Hall measurement, the Hall mobility difference at any point in the σ-H curve can be given as:

$$\Delta\mu_H = \frac{d(\sigma^2 H)}{d\sigma} = \left(2 + \frac{d\ln H}{d\ln\sigma}\right)\sigma H \tag{1}$$

where $\Delta\mu=\mu_P-\mu_N=\Delta\mu_H/r$ is the difference between the hole and electron mobility. Solving for the majority and minority carriers results in the following equations for a P-type material:

$$\beta = \frac{2\sigma(r\Delta\mu - \sigma H) - r\Delta\mu^2 e p_0 \pm \Delta\mu \sqrt{e p_0}\sqrt{r^2\Delta\mu^2 e p_0 + 4r\sigma(\sigma H - r\Delta\mu)}}{2\sigma(r\Delta\mu - \sigma H)} \tag{2}$$

$$\Delta n = \Delta p = \frac{\sigma(1 - \beta) - \Delta\mu e p_0}{\Delta\mu e(1 + \beta)} \tag{3}$$

and for N-type material:

$$\beta = \frac{2\sigma(r\Delta\mu - \sigma H) + r^2\Delta\mu^2 e n_0 \pm \Delta\mu\sqrt{e n_0}\sqrt{r^2\Delta\mu^2 e n_0 + 4r\sigma(\Delta\mu - r\sigma H)}}{2\sigma(r\Delta\mu - \sigma H)} \tag{4}$$

$$\Delta n = \Delta p = \frac{\sigma(1 - \beta) - e\Delta\mu n_0 \beta}{e\Delta\mu(1 + \beta)}. \tag{5}$$

And for both P and N-type material:

$$\mu_P = \frac{\Delta\mu}{1 - \beta} \text{ and: } \mu_N = \beta\mu_P \tag{6}$$

Accordingly, in one or more of the embodiments, the systems and methods can determine both majority carrier mobility $\mu_M$ and minority carrier mobility $\mu_m$.

In addition, as described further below, the systems and methods of one or more embodiments can now determine photocarrier density (Δn); recombination lifetime (τ); majority carrier diffusion length ($L_{D,M}$); and minority carrier diffusion length ($L_{D,m}$) and ambipolar diffusion length ($L_{D,am}$). These parameters can be obtained from photo-Hall measurements of the sample-under-test at various light intensity settings N from dark to maximum brightness.

For example, at various light illumination modulations, the absorbed photon density $G_\gamma$ can be determined based on the following relationship:

$$G_\gamma=(1-R)\Phi(1-\exp(-\alpha d))/d \tag{7}$$

The photon flux density (Φ) impinging on the sample can then be calculated as:

$$\Phi = \frac{I_{PD-MON} k_{PD}}{eQE_{REF}(\lambda) A_{REF}} \tag{8}$$

where α is absorption coefficient (/m), R is reflectivity of the sample, $I_{PD,MON}$ is a monitor photodetector (PD,MON) current, d is the sample thickness, and $k_{PD}$ is the ratio of the current between a reference photodetector (PD,REF) and the monitor photodetector (PD,MON). This ratio can be determined in a calibration step where the reference PD is a silicon photodetector that is placed in the sample position and measured simultaneously with the monitor PD. $QE_{REF}$ is the quantum efficiency of the reference PD, $A_{REF}$ is the area of the reference PD, and $\lambda$ is the operating wavelength. The absorbed photon density can be calculated as a function of light intensity or photo-current as measured at the monitor photodetector ($I_{PD\text{-}MON}$):

$$G_\gamma = k_G(\lambda) I_{PD\text{-}MON} \qquad (9)$$

where $k_G$ is the photon density constant of the experimental setup:

$$k_G(\lambda) = \frac{k_{PD}[1 - R(\lambda)]}{eQE_{REF}(\lambda)A_{REF}} \frac{[1 - \exp(-\alpha(\lambda)d)]}{d} \qquad (10)$$

Furthermore, in one or more embodiments, in view of the photo-generated carrier density ($\Delta n$ and $\Delta p$) that was previously calculated (e.g., from equations 1-3 above), a series of derivative parameters can be calculated, such as recombination lifetime:

$$\tau = \Delta n / G \qquad (11)$$

where G is the photocarrier generation rate which is assumed to be equal to the absorbed photon density $G_\gamma$ for a unity quantum efficiency. The recombination lifetime can be a constant at low light intensity or monomolecular recombination regime. For example, if $k_1 = 1/\tau$, where $k_1$ is a monomolecular recombination coefficient. At higher light intensity, $\tau$ tends to drop due to a charge trapping effect, bimolecular recombination and an Auger recombination at very high light intensity. Accordingly, in one or more embodiments, majority or minority carrier diffusion length can be obtained from the equation:

$$L_D = \sqrt{D\tau} = \sqrt{k_B T \mu \tau / e}. \qquad (12)$$

where D is the carrier diffusion coefficient and T is the temperature. At high injection levels when the photocarrier density for hole and electron are much higher than dark equilibrium density (e.g. $\Delta n \sim \Delta p \gg p_0$), in this case the ambipolar diffusion length is more appropriate and can be calculated according to the following equation:

$$L_{D,am} = \sqrt{\frac{k_B T \tau}{e} \frac{n + p}{n/\mu_P + p/\mu_N}} \qquad (13)$$

Therefore, in one or more embodiments, a new Photo-Hall technique can be considered carrier-resolved because characteristics of both the majority carriers and the minority carriers can be extracted. For example, the technique can yield 7N parameters, including but not limited to: the majority/minority or hole/electron carrier mobility ($\mu_P, \mu_N$), photocarrier density ($\Delta n$), recombination lifetime ($\tau$), and diffusion length for hole, electron and ambipolar transport ($L_{D,P}, L_{D,N}, L_{D,am}$), where N is the number of light intensity settings in the measurement.

Non-limiting examples of various systems and methods will now be described with reference to FIGS. 2-10.

Figure 2:
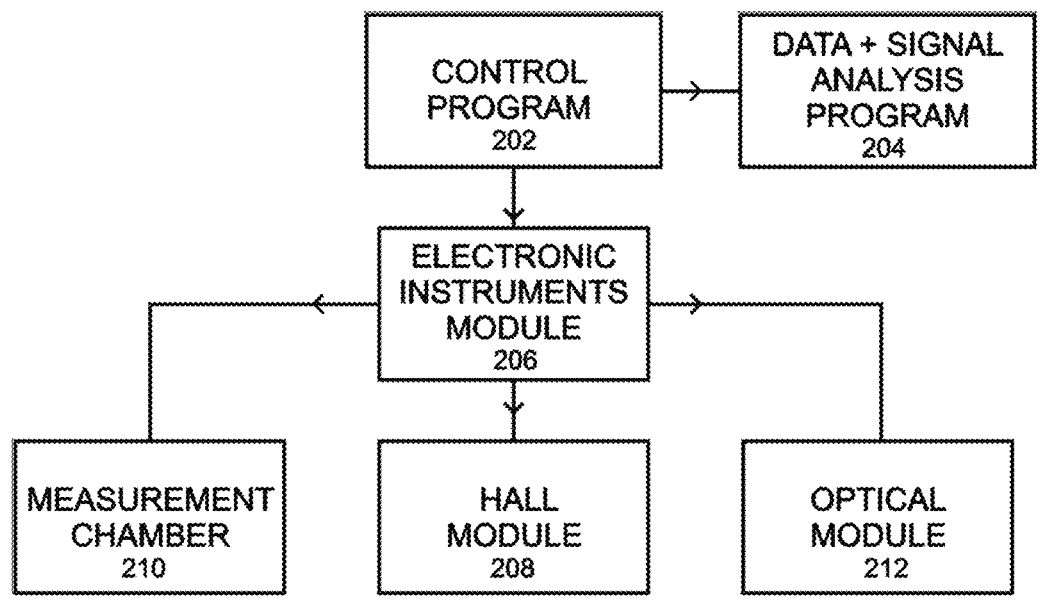
FIG. 2 illustrates an example, non-limiting, block diagram of a system in accordance with one or more embodiments described herein.

FIG. 2 illustrates an example, non-limiting, block diagram of a system 200 in accordance with one or more embodiments described herein. As shown, the system 200 can include a control program 202, data and signal analysis module 204, an electronic instruments module 206, a Hall module 208, a measurement chamber 210, and an optical module 212.

The control program 202 can control the electronic instrument module 206 and the overall operation of the system 200 from data acquisition to data storage and reporting. For instance, the control program can interact with a user, takes input for sample information, and can control the data and signal analysis module 204, the electronics instruments module 206, Hall module 208, measurement chamber 210, and optical module 212.

The data and signal analysis program 204 can perform signal processing and calculation, such as Fourier spectral analysis and lock-in detection. For instance, the data and signal analysis program 204 can generate, pre-process and display visualizations of Fourier spectra or a power spectral density of the magnetoresistance (MR) signal and perform lock-in detection and calculate the Hall coefficients at every light intensity. In one or more embodiments, the program 204 can comprise executable program code to implement the carrier-resolved photo-Hall techniques and calculations illustrated by equations (1)-(13) described above.

The electronic instruments module 206 can contain a set of electronics sub-modules to perform source and measure operation, switch matrix and buffering, motor control, field sensing and cryostat temperature control.

The Hall module 208 contain a magnet or electromagnet system. For example, the Hall module 208 can contain a set of motor driven and (multiple) freely rotating dipole line magnets, a field sensor, a sample stage, and electrical interconnects. Various non-limiting examples of different versions of Hall modules are illustrated with reference to FIGS. 3A-3C.

Measurement chamber 210 can be an enclosed vacuum chamber in which sample measurements are conducted, or part of a manufacturing in-line test system. In one or more embodiments, the measurement chamber can comprise a cryostat. The module 210 can contain a vacuum chamber, a cold stage, a refrigerator engine, and control electronics.

The optical module 212 can further include a system to provide illumination to the sample, such as a monochromatic or broadband light source, a continuous neutral density filter, a harmonic modulator filter wheel, photodetectors and a beam splitter. The optical module can comprise one or more lasers as a monochromatic light source. Alternatively, the optical module 212 can comprise a broad band light source and monochromator as the light source.

In one or more embodiments, the optical module 212 routes light through a continuous neutral density filter controlled by a motor to attenuate the light. In addition, the optical module 212 can optionally comprise a harmonic modulator filter wheel (not shown) that adds additional light modulation to provide fine tuning (e.g. +/−50% of the light intensity). The harmonic modulator filter wheel generates sinusoidal attenuation under constant rotation. The optical module 212 can further comprise a lens, beam splitter and a prism or a wedge lens to a sample-under-test in the measurement chamber 210.

Figure 3A:
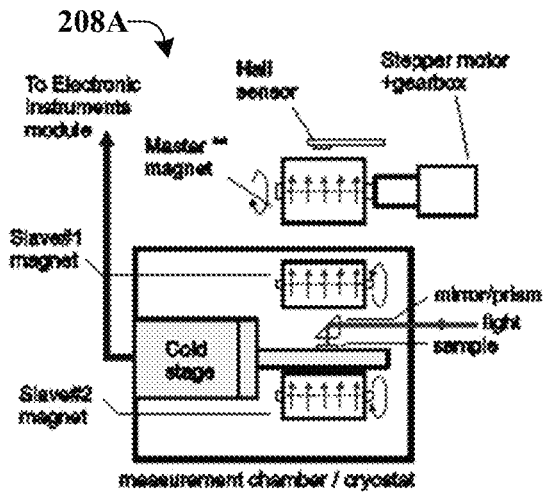
FIGS. 3A-3C illustrate example, non-limiting Hall modules in accordance with one or more embodiments described herein.
Figure 3B:
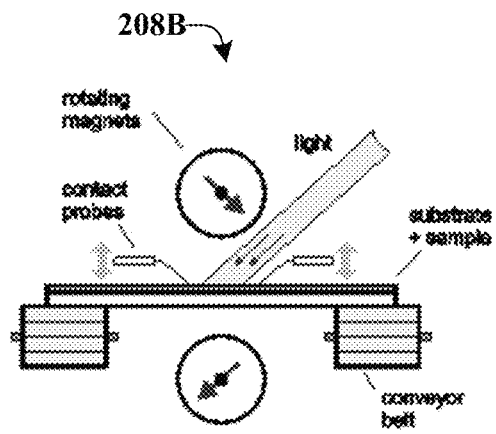
Figure 3C:
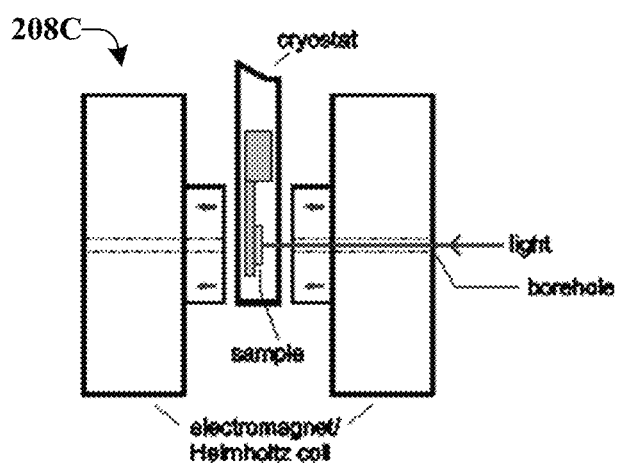

FIGS. 3A-3C illustrate example, non-limiting Hall modules in accordance with one or more embodiments described herein. As shown, various configurations of Hall modules can be used in the embodiments, such as in system 200. Repetitive description of like elements employed in other embodiments described herein is omitted for sake of brevity.

FIG. 3A illustrates a Hall module 208A that comprises rotating magnets, such as rotating parallel dipole line magnets, to provide an AC magnetic field. One or two magnets reside inside the measurement chamber 210 and an external magnet is rotating outside to drive the magnet assembly that is inside the chamber 210.

FIG. 3B illustrates an in-line Hall module 208B. Hall module 208B is provided in-line, for example, with a production line allow for Hall measurements of devices in-line within a manufacturing process line. As shown, illumination is routed (e.g., from optical module 212) onto the manufacturing line to illuminate a sample-under-test, while in production, for example, on a conveyor belt. Rotating magnets, such as rotating parallel dipole line magnet, provide an AC magnetic field for the Hall measurements that are accessed via one or more contact probes. In one or more embodiments, in-line Hall module 208B allows for faster or more rapid in-line photo Hall measurements of devices during a manufacturing process.

FIG. 3C illustrates a Hall module 208C that comprises electromagnets to provide an AC magnetic field. As shown, the Hall module 208C can comprise, for example, an AC electromagnet system or Helmholtz coil system driven by a AC power supply (not shown). In this embodiment, light from optical module 212 passes through a bore hole to the sample held in a measurement chamber, such as a cryostat.

Figure 4:
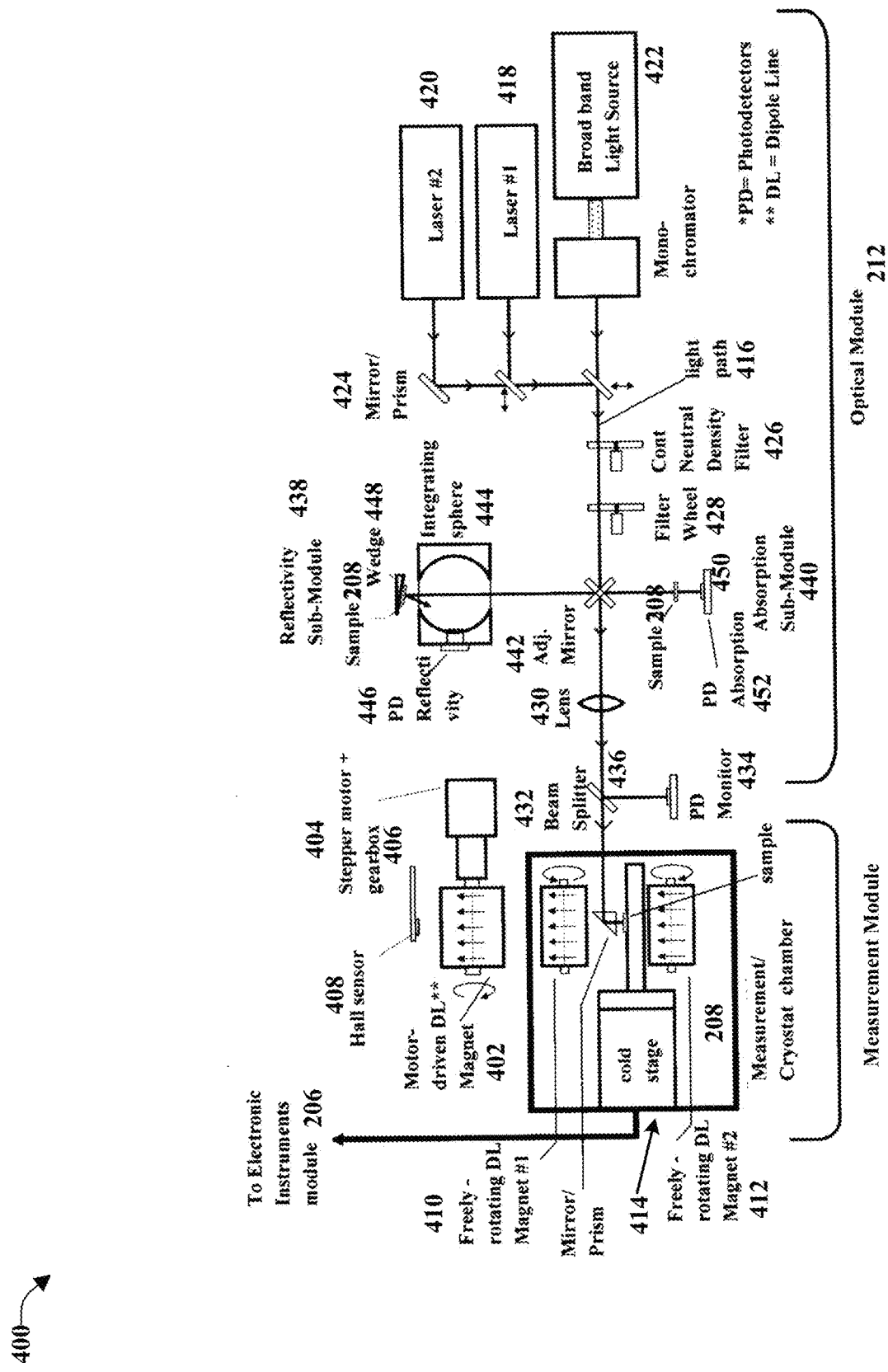
FIG. 4 illustrates an example, non-limiting system, in accordance with one or more embodiments described herein.

FIG. 4 illustrates an example, non-limiting system, in accordance with one or more embodiments described herein. A detailed description of each component of system 300 is now provided. Repetitive description of like elements employed in other embodiments described herein is omitted for sake of brevity. Accordingly, FIG. 4 shows an exemplary configuration 400 of the Hall module 208, measurement module 210, and optical module 212 of system 200.

For purposes of illustration, in the example shown in FIG. 4, the Hall module 208 and measurement chamber 210 can include a dipole line (DL) magnet 402 driven by a motor 404 and gearbox 406, e.g., in a configuration like that of Hall module 208A shown in FIG. 3A. Repetitive description of like elements employed in other embodiments described herein, such the embodiments illustrated in FIGS. 3B-3C, is omitted for sake of brevity. In one or more embodiments, the DL magnet 402 can be cylindrical with uniform transverse magnetization whose poles (north or south pole) are on opposite sides of the curved surface.

In Hall module 208, a Hall sensor 408 can positioned adjacent to the Motor-driven DL magnet 402 to monitor the phase or rotation angle of the magnets. The Hall sensor 408 can be a device that varies its output voltage in response to a magnetic field.

One or more freely rotating DL magnets 410 can be located within the measurement chamber 310. The first freely rotating DL magnet 410 can be positioned within a region of the chamber 310 proximal to the motor-driven DL magnet 402. For example, the motor-driven DL magnet 402 can be adjacent to a top side of the chamber 210. Thus, the first freely rotating DL magnet 410 can be present within the chamber 210, proximal to the top side of the chamber 210. This configuration can allow the motor-driven DL magnet 402 and its associated hardware (such as stepper motor 404 and gearbox 406) to be placed outside of the chamber 210. In one or more embodiments this arrangement can be used to save space within the chamber 210 and prevent exposure of the motor 404 and other hardware to the low temperature environment within the chamber 210.

Optionally, at least one second freely rotating DL magnet 412 can also be included in the chamber 210. The second freely rotating DL magnet 412 can be included to improve the field strength on the sample that is under test. As shown in FIG. 4, when present, the second freely rotating DL magnet 412 can be located within the chamber 210 opposite the first freely rotating DL magnet 410 (with the sample, etc. positioned there between) and distal from the motor-driven DL magnet 402.

As also shown in FIG. 4, the motor-driven DL magnet 402 can be adjacent to a top side of the chamber 210, and the second freely rotating DL magnet 412 can be located distal from the top side of the chamber 210 (i.e., adjacent to the bottom side of the chamber). As also shown in FIG. 4, the direction of rotation of the motor-driven DL magnet 402 can be opposite to that of the first freely rotating DL magnet 410 and, when present, the same as that of the second freely rotating DL magnet 412. The rotation of the first freely rotating DL magnet 410 can be based on the rotation of the motor-driven DL magnet 402, while the rotation of the second freely rotating DL magnet 412 can be based on the rotation of the first freely rotating DL magnet 412.

A cold stage 414 can be used to regulate the temperature of the sample in the measurement chamber 210. As shown in FIG. 4, the cold stage 414 can be regulated by an electronic instruments module 306.

A sample stage permits the sample to be mounted in one of two orientations: perpendicular or parallel relative to the total magnetic field. A sample stage (not shown) analysis of sample 208 perpendicular to the magnetic field for photo-Hall or parallel with the magnetic field for Photo-Electro-Magnet (PEM) measurement. When the sample is mounted perpendicular to the total magnetic field (e.g., sample is on the y-z plane), Hall measurements can be made. When the sample is mounted parallel to the total magnetic field (e.g., sample is on the x-z plane), PEM measurements can be made. A different sample mount or movable/rotatable mount can be used to mount the sample in these two orientations.

Figure 5:
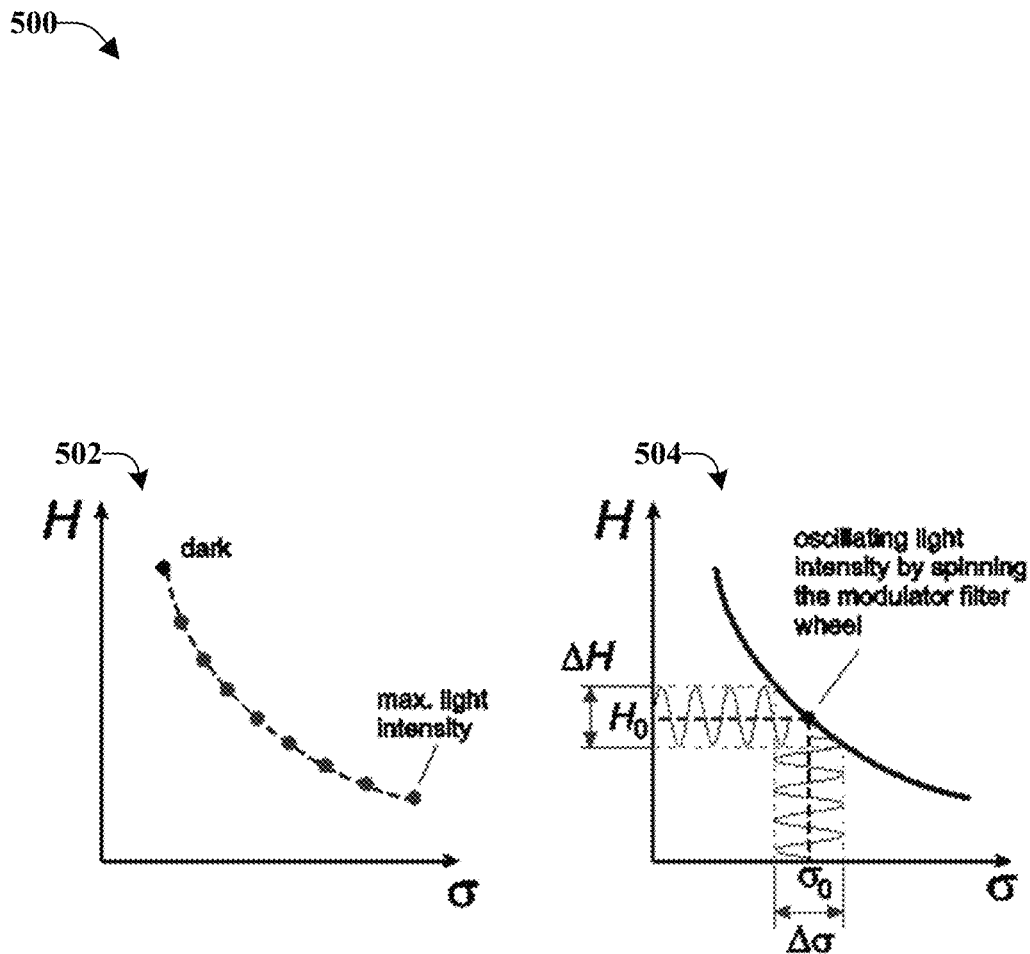
FIG. 5 illustrates example, non-limiting, modulations of light illuminating a sample under test for Carrier-Resolved Photo-Hall measurements, in accordance with one or more embodiments described herein.

FIG. 5 illustrates example, non-limiting, modulations of light illuminating a sample under test for carrier-resolved Photo-Hall measurements, in accordance with one or more embodiments described herein. In one embodiment, an optical module (such as optical module 212) is controlled to provide light that is varied from dark to bright at discrete settings and intervals as illustrated by illumination 502. Hall measurements ($\sigma$, H) can then be performed at this discrete settings and intervals provided under illumination 502.

In another embodiment, light is modulated according to illumination 504 around a bias point, such as $\sigma_0$. An initial measurement of $\sigma$ and H at $\sigma_0$ is performed. A modulator filter wheel can be turned in optical module 212 (not shown in FIG. 5) to provide illumination that oscillates the light intensity by $\Delta\sigma$ around the bias point $\sigma_0$. Consistent with equations (1)-(13) described above, the slope can be measured experimentally and $dH/d\sigma \sim \Delta H/\Delta\sigma$ to solve for the various minority and majority carrier characteristics. This embodiment can be used to enable more rapid measurement, for example, if Hall measurements are desired at a certain light intensity or under certain conditions. In addition, this embodiment can be less prone to long term drift errors due to its shorter range of illumination and measurements.

Figure 6:
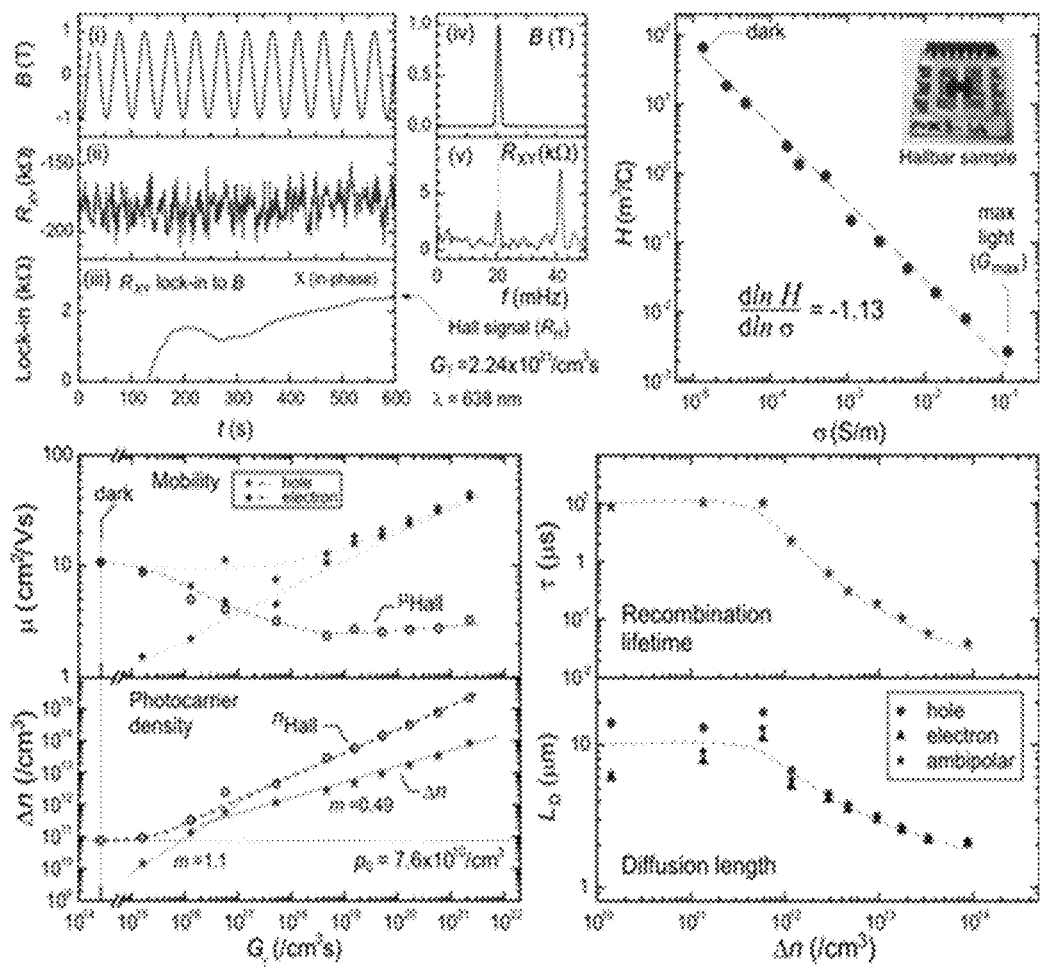
FIG. 6 illustrates example, non-limiting Photo-Hall measurement analysis results that can be produced by the system shown in FIG. 2, in accordance with one or more embodiments described herein.

FIG. 6 illustrates example, non-limiting Hall measurement analysis results that can be produced by the system shown in FIG. 2, in accordance with one or more embodiments described herein. For example, as shown, Hall measurement analysis results that can be provided by data+signal analysis program 204 for a perovskite six-terminal Hall bar sample are shown as an exemplary, non-limiting display. In particular, the data+signal analysis program 204 can output results showing: AC field magnetoresistance data; $\sigma$-H plot analysis; mobility and carrier density; and recombination lifetime and diffusion length. The plots and configuration of the display are exemplary, non-limiting outputs. Any type of display of results can be provided in according with the embodiments.

Figure 7:
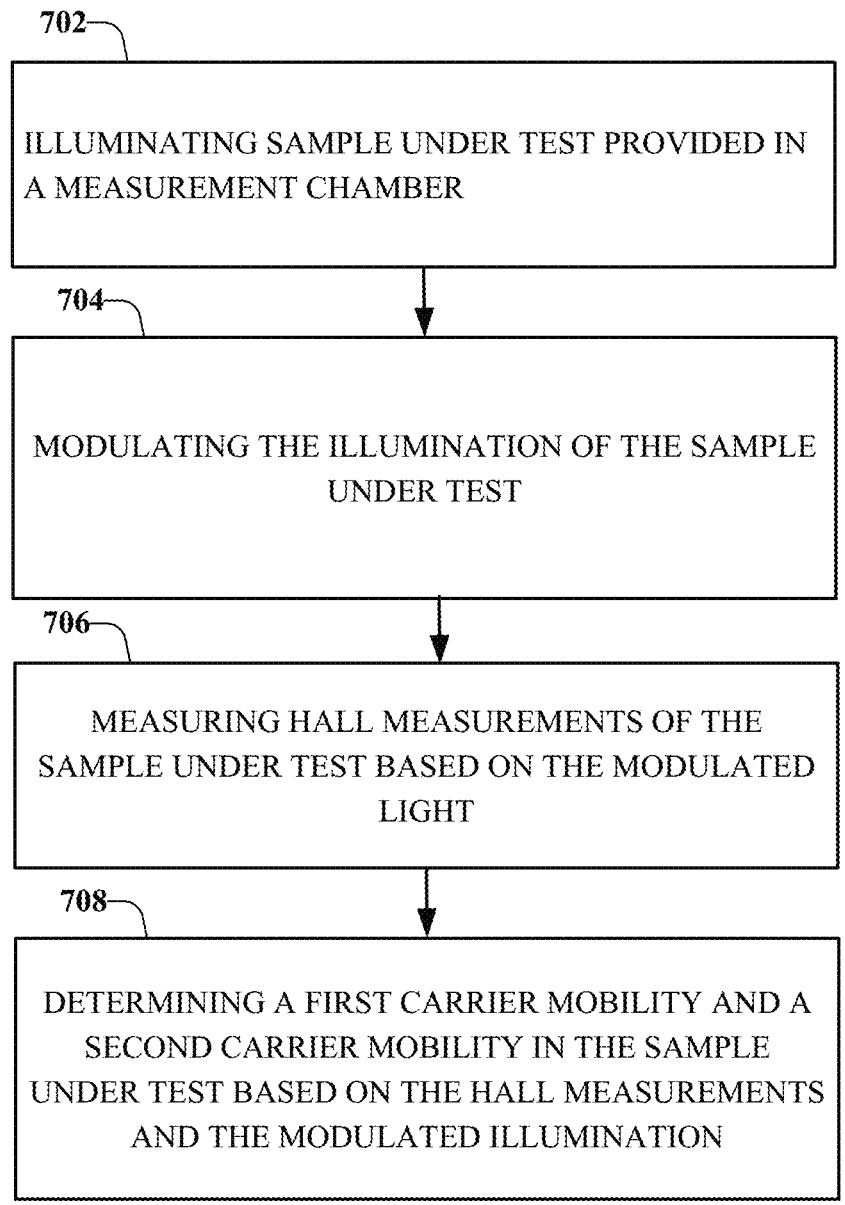
FIG. 7 illustrates an example, non-limiting, for a method for Photo-Hall measurement, in accordance with one or more embodiments described herein.

FIG. 7 an example, non-limiting, for a method 700 for Hall measurement according, in accordance with one or more embodiments described herein. Repetitive description of like elements employed in other embodiments described herein is omitted for sake of brevity.

At 702, the method 700 can include illuminating a sample that is under test provided in measurement chamber 210.

At 704, the method 700 can include modulating the illumination of the sample that is under test.

At 706, the method 700 can include measuring Hall measurements of the sample that is under test based on the modulated illumination, such as the modulated illumination shown in FIG. 5. In one or more embodiments, a sample is measured to determine its conductivity, Hall coefficient, and a derivative (or slope) of the change in Hall coefficient versus a change in conductivity. This can be performed by measuring the Hall coefficient and conductivity over a range of light intensities using, for example, continuous density filter 426 and filter wheel 428. Alternatively, the conductivity and Hall coefficient can be measured at a selected light intensity and then the filter wheel 428 can be rotated to obtain the derivative (or slope) based on the resulting measurements.

At 708, the method 700 can include determining a first carrier mobility, a second carrier mobility and the photocarrier density in the sample under test based on the Hall measurements and the modulated illumination. In one embodiment, the first (or majority) carrier mobility and second (or minority) carrier mobility can be determined based on an iterative process that takes into consideration the photo-Hall measurements of the sample, the difference in carrier mobilities, and an error rate between subsequent solutions. This iterative process can be processed by various techniques, such as a machine learning algorithm executed by data+signal analysis program 204 operating in environment 1000 to model the error rate and develop a converged solution for the measurements of sample. An example, non-limiting process flow for developing a converged solution is provided with reference to FIG. 9 in accordance with one or more embodiments.

Figure 8:
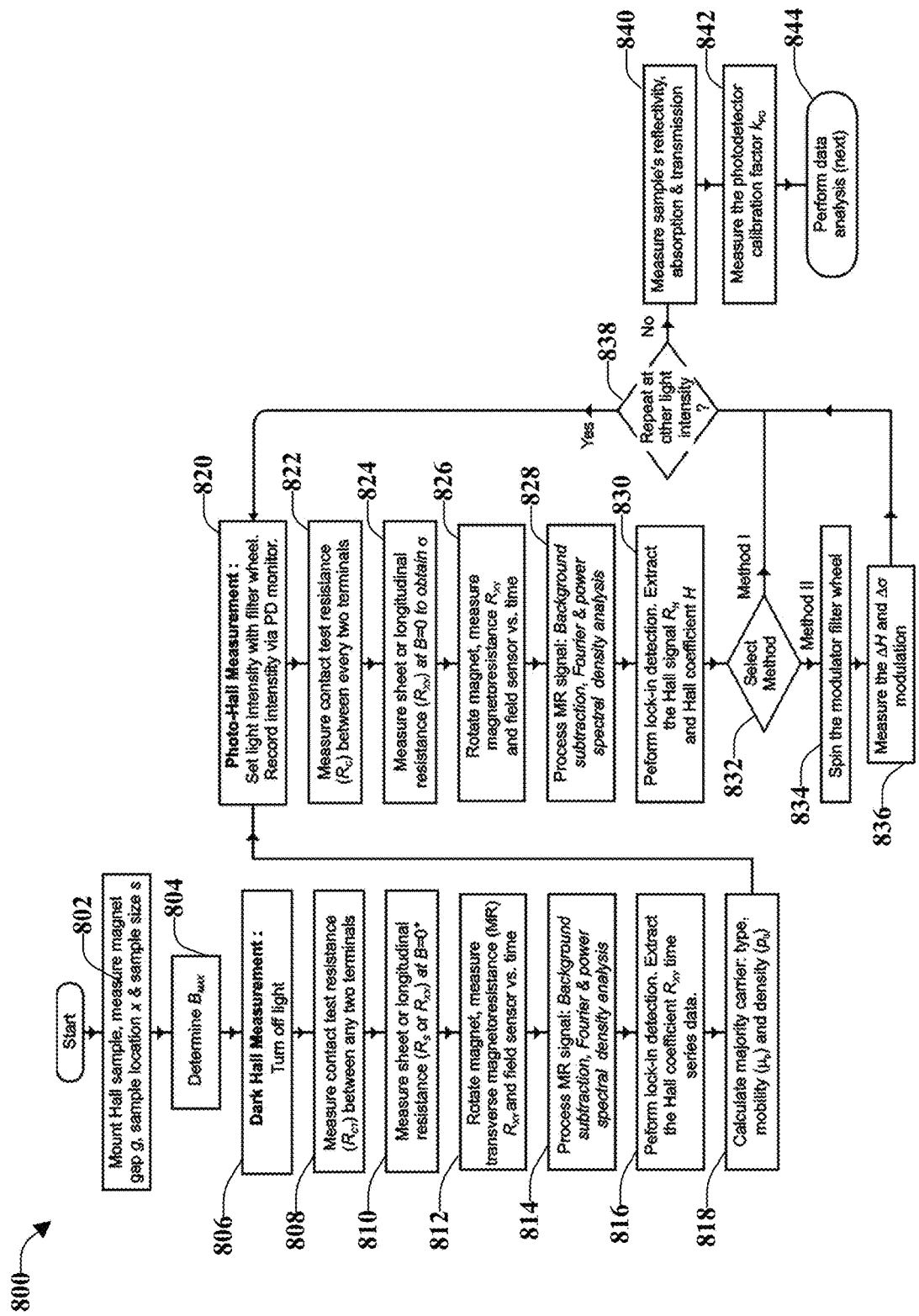
FIG. 8 illustrates another example, non-limiting, for a method for Photo-Hall measurement, in accordance with one or more embodiments described herein.

FIG. 8 illustrates an example, non-limiting, for a method 800 for Hall measurement according, in accordance with one or more embodiments described herein. For example, method 800 can be implemented by control program 202 to provide one or more methods of Hall measurements as described above. Repetitive description of like elements employed in other embodiments described herein is omitted for sake of brevity.

At 802, the sample is mounted, for example, in measurement chamber 210. Control program 202 instructs measurement chamber 210 to measure a magnet gap g, sample location x, and sample size a.

At 804, the maximum magnetic field $B_{max}$ on the sample is determined. For example, by measuring the gap between the dipole line magnets with the sample is placed at the center.

At 806, dark Hall measurements are taken. For example, control program 202 can instruct optical module 212 to turn off illumination of the sample, and thus, subject the sample to dark or low-level light conditions in the measurement chamber 210.

At 808, the control program 202 measures a contact resistance of the sample in the measurement chamber 210.

At 810, the control program 202 measures a sheet or longitudinal resistance of the sample in the measurement chamber 210.

At 812, the control program 202 instructs the Hall module 208 to create an AC magnetic field, for example, by rotating magnet 402 (shown in FIG. 4). Control program 202 can then measure a transverse magnetoresistance (MR) of the sample.

At 814, the control program 202 and data+signal program 208 cooperate to process the MR signal. For example, the data+signal program 208 can perform background subtraction and Fourier and power spectral density analysis of the sample. As noted above, a non-limiting example of the analysis and results are shown with reference to FIG. 6.

At 816, the control program 202 performs lock-in detection and extracts the Hall coefficient H from the measurement. In one embodiment, the control program 202 determines the Hall coefficient from time-series transverse, magnetoresistance data ($R_{XY}$) extracted from the sample.

At 818, the control program 202 calculates majority carrier type, type mobility, and density.

At 820, the control program 202 performs photo Hall measurements of the sample. In one or more embodiments, the control program 202 instructs optical module 212 to set a light intensity, e.g., using filter wheel 428 (shown in FIG. 4). In addition, the control program 202 can record this light intensity level using PD monitor 434 (shown in FIG. 4).

At 822, the control program 202 measures the contact resistance of the sample.

At 824, the control program 202 measures the longitudinal resistance of the sample at magnetic field B=0 and determines the conductivity σ of the sample.

At 826, the control program 202 instructs the Hall module 208 to modulate the AC magnetic signal provided to the measurement chamber 210. Control program 202 then measures the transverse MR ($R_{XY}$) of the sample over time that results from the AC magnetic signal.

At 828 the control program 202 and data+signal program 204 cooperate to process the MR signal again to perform background subtraction and Fourier and power spectral density analysis of the sample.

At 830, the control program 202 performs lock-in detection and extracts the Hall signal and determines the Hall coefficient H of the sample.

At 832, the control program 202 selects a method of modulating the illumination. As noted above, non-limiting examples of modulating the illumination were described with reference to FIG. 5. The control program 202 can select the method of modulating the illumination based on various criteria, such as user input, and/or one or more settings in the control program 202. For purposes of illustration, at 832, the control program 202 can select between methods I or II. If control program 202 selects method I, then process 800 proceeds to 834. If control program 202 selects method II, then process 800 proceeds to 838.

At 834, the control program 202 has selected method II and instructed the optical module 212 to spin harmonic modulator filter wheel 428 (as shown in FIG. 4).

At 836, the control program 202 measures ΔH (change in Hall coefficient) and Δσ (change in conductivity) based on the modulation of illumination provided by the optical module 212.

Processing then flows to 838. At 838, the control program 202 determines whether to repeat at another light intensity, for example, in accordance with the light modulation illustrated in FIG. 5. If control program 202 elects to repeat at another light intensity, then processing flows back to 820 and proceeds as described above. If control program 202 elects to not repeat, then processing flows to 840.

At 840, the control program 202 measures the sample's reflectivity absorption and transmission, for example, absorption PD 452 and absorption sub-module 440 (shown in FIG. 4).

At 842, the control program 202 measures a PD calibration factor, $k_{PD}$. The calibration factor can be determined based on a reference PD, such as a silicon PD, that has been placed as a sample in the measurement chamber 210.

At 844, the control program 202 and data+signal analysis program 204 cooperate to output various data analysis results. As noted above, in one or more embodiments, the Carrier-Resolved Photo-Hall techniques described herein enables extraction and measurement of both majority and minority carrier characteristics. In addition, parameters such as recombination lifetime, diffusion length and recombination coefficient can be determined. As noted above, example, non-limiting results that can be provided by control program 202 and/or data+signal analysis program 204 are shown with reference to FIG. 6.

Figure 9:
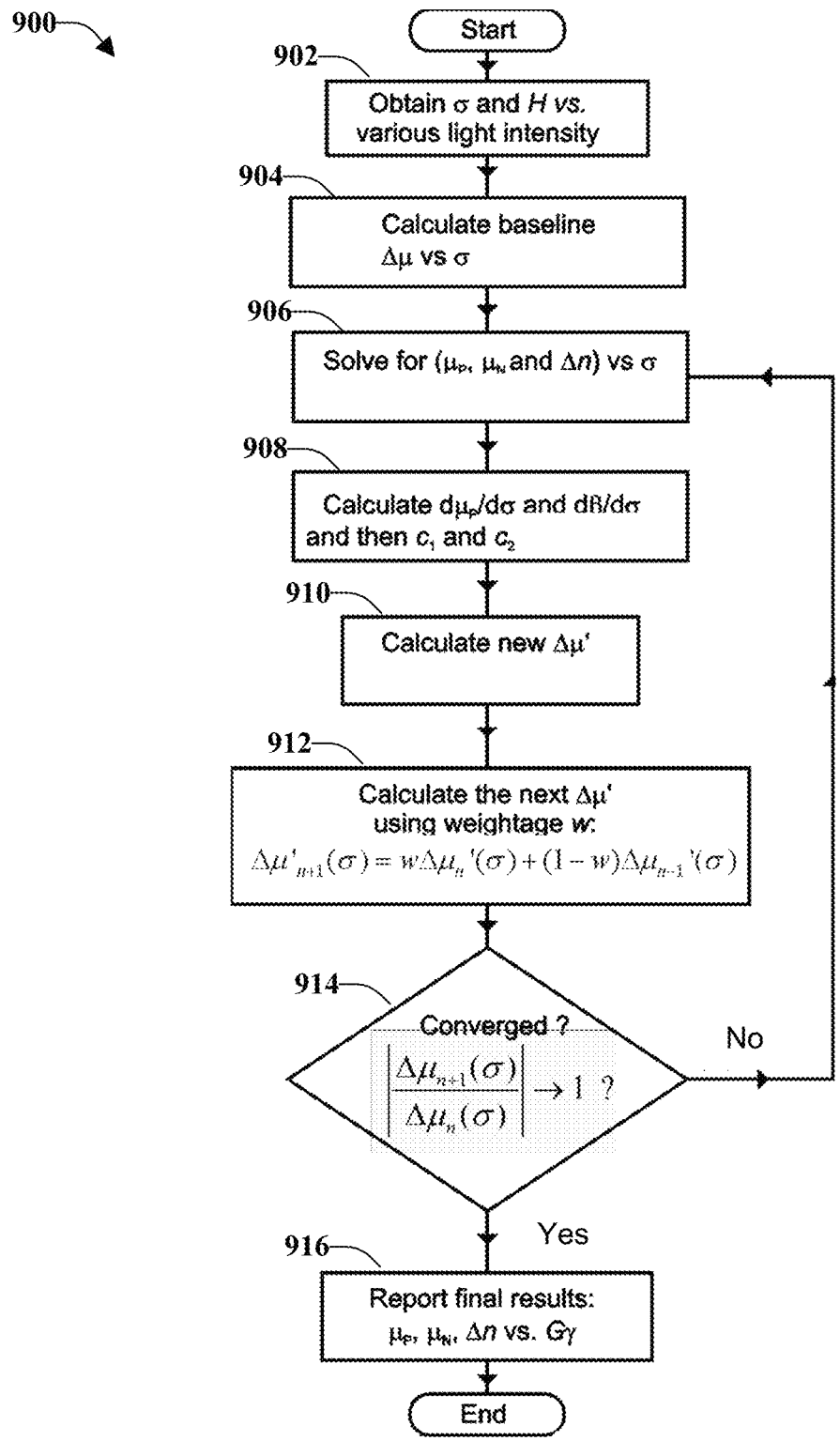
FIG. 9 illustrates an example, non-limiting, for a method for validating a Photo-Hall measurement, in accordance with one or more embodiments described herein.

FIG. 9 illustrates an example, non-limiting, for a method 900 for photo-Hall measurement with varying mobility according, in accordance with one or more embodiments described herein. In one embodiment, the first (e.g., majority) carrier mobility and second (e.g., minority) carrier mobility can be determined based on an iterative process that takes into consideration the photo-Hall measurements of the sample, the difference in carrier mobilities, and an error rate between subsequent solutions. This iterative process can be processed by operating environment 1000 to calculate the error rate between subsequent solutions and to obtain a converged solution for the measurements.

For example, method 900 can be implemented by control program 202 and data+signal analysis program 204 operating in environment 1000 to obtain a converged solution. A converged solution can be tested to confirm whether the carrier mobilities are constant. If the carrier mobilities are not constant, then the data+signal analysis program 204 can be configured to use a generalized equation and perform iterative calculation until the solution converges. An example, non-limiting process will not be described for method 900.

At 902, the control program 202 obtains the conductivity, σ, and Hall coefficient, H, as previously described above.

At 904, control program 202 cooperates with the data+signal analysis program 204 to calculate a baseline or initial values for the $\Delta\mu$ (change in mobility) and $\Delta n$ (photocarrier density).

At 906, the control program 202 cooperates with the data+signal analysis program 204 to solve for carrier mobilities $\mu_P$ and $\mu_N$ and photocarrier density $\Delta n$ versus conductivity ($\sigma$).

At 908, the control program 202 cooperates with the data+signal analysis program 204 to calculate the following:

$$\Delta\mu_H' = [\Delta\mu_H + c_1]c_2. \quad (14)$$

where:

$$\Delta\mu_H = \frac{d(\sigma^2 H)}{d\sigma} = \left(2 + \frac{d\ln H}{d\ln\sigma}\right)\sigma H. \quad (15)$$

$$c_1 = 2e\mu_p\left(\mu_P\Delta n\beta\frac{d\beta}{d\sigma} - \frac{d\mu_P}{d\sigma}[p_0 + \Delta n(1-\beta^2)]\right). \quad (16)$$

$$c_2 = \left(1 - e\mu_P\Delta n\frac{d\beta}{d\sigma} - e\frac{d\mu_P}{d\sigma}[p_0 + \Delta n(1+\beta)]\right)^{-1}. \quad (17)$$

At 910, the control program 202 cooperates with the data+signal analysis program 204 iterates to calculate a new $\Delta\mu'$.

At 912, the control program 202 cooperates with the data+signal analysis program 204 iterates to calculate the next $\Delta\mu'$ based on a weightage coefficient w: $\Delta\mu'_{n+1}(\sigma) = w\Delta\mu_n'(\sigma) + (1-w)\Delta\mu_{n-1}'(\sigma)$, where n is the iteration number.

At 914, the control program 202 determines whether solutions for $\Delta\mu'$ are converging. For example, the control program 202 can use the following equation to check for convergence: $|\Delta\mu_{n+1}(\sigma)/\Delta\mu_n(\sigma)| \to 1$.

If solutions for $\Delta\mu'$ are converged, then processing flows to 916. If not, then processing repeats at 906.

At 916, the control program 202 cooperates with the data+signal analysis program 204 to report final results that are considered converged for carrier mobilities, photocarrier density ($\Delta n$) and absorbed photo density $G_\gamma$. The system can incorporate deep neural network to classify various photo-Hall measurements scenarios from various samples.

Figure 10:
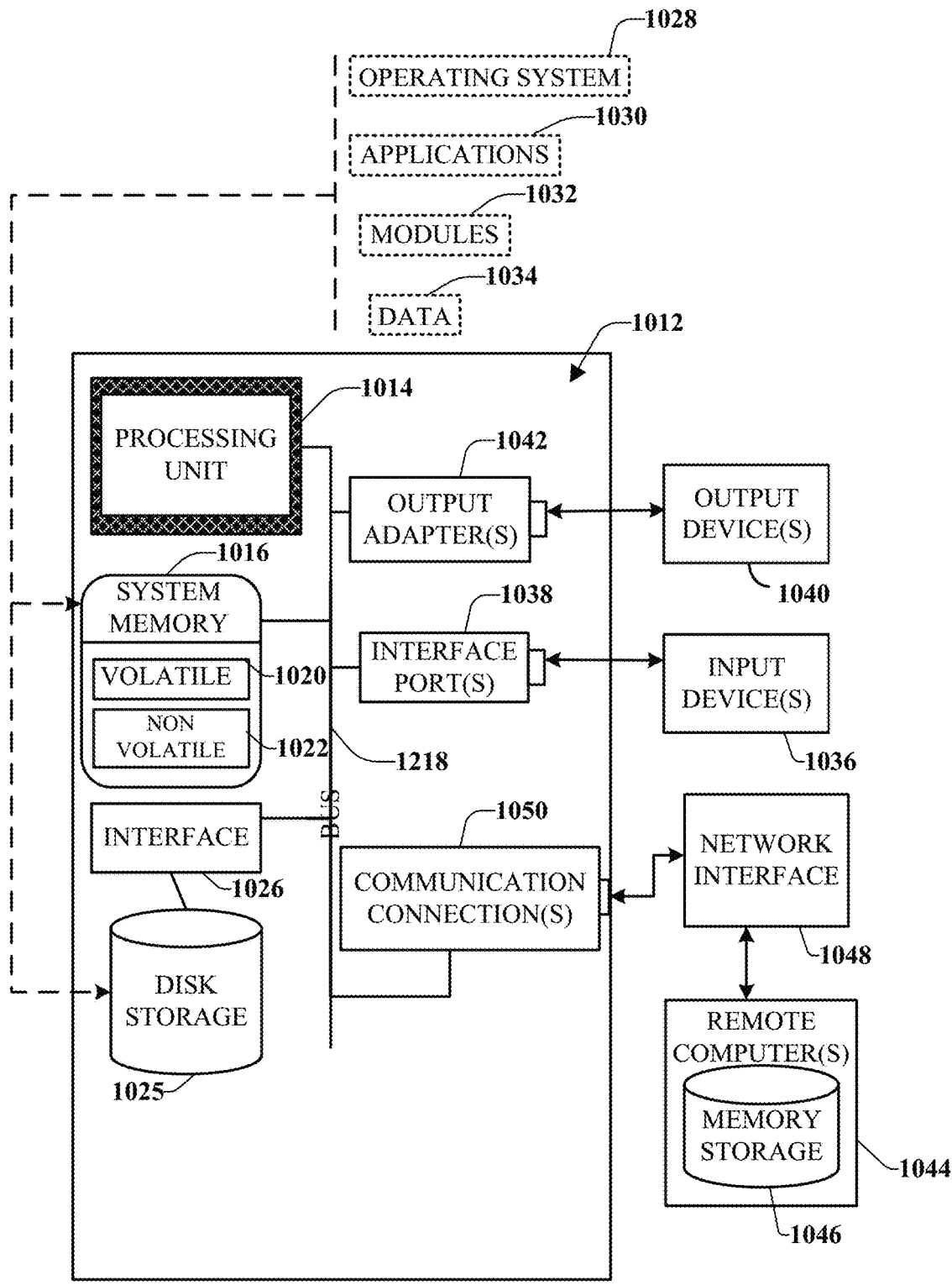
FIG. 10 illustrates an example, non-limiting, an exemplary apparatus for performing one or more of the methodologies described herein, in accordance with one or more embodiments described herein.

FIG. 10 as well as the following discussion are intended two provide a general description of a suitable environment in which the various aspects of the disclosed subject matter can be implemented. Repetitive description of like elements employed in other embodiments described herein is omitted for sake of brevity. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1010, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language, Matlab, Python or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A measurement system, comprising:
  an optics module coupled to a measurement chamber and comprising:
    a light source; and
    a filter that modulates light from the light source and illuminates a sample under test with modulated light from the light source, wherein the filter is a harmonic modulator filter placed along a light path between the light source and the sample under test; and a Hall measurement module that outputs one or more Hall measurements that indicate at least one carrier mobility of the sample-under-test based on the modulated light.

2. The measurement system of claim 1, further comprising:
an instruments module coupled to the Hall measurement module.

3. The measurement system of claim 2, wherein the instruments module provides an output that indicate the at least one carrier mobility, a second carrier mobility and photocarrier density.

4. The measurement system of claim 3, wherein the instruments module comprises a deep neural network that determines a quality of the Hall measurements from the Hall measurement module.

5. The measurement system of claim 4, wherein the instruments module determines conductivity and Hall coefficient as a function of an oscillation of the modulated light based on the Hall measurements from the Hall measurement module.

6. The measurement system of claim 3, wherein the instruments module determines conductivity and Hall coefficient as a function of an intensity of the modulated light based on the Hall measurements from the Hall measurement module.

7. A method comprising:
illuminating, by a system operatively coupled to a processor, a sample under test provided in a measurement chamber;
modulating, by the system, the illumination of the sample under test, wherein the modulating the illumination of the sample under test comprises oscillating a light intensity of the illumination around a selected light intensity; and
determining, by the system, at least a carrier mobility based on the Hall measurements and the modulated illumination.

8. The method of claim 7, wherein the modulating the illumination of the sample under test further comprises modulating an intensity of the illumination from a first intensity to a second intensity.

9. The method of claim 8, wherein the measuring Hall measurements comprises measuring conductivity of the sample under test as a function of the intensity of the illumination.

10. The method of claim 9, wherein the measuring Hall measurements further comprises measuring a Hall coefficient of the sample under test as a function of the intensity of the illumination.

11. The method of claim 8, wherein the measuring Hall measurements comprises measuring conductivity and Hall coefficient of the sample under test as a function of the oscillation of the light intensity.

12. The method of claim 8, further comprising:
determining the at least one carrier mobility, a second carrier mobility and a photocarrier density.

13. The method of claim 12, wherein the determining comprises:
classifying, by a deep neural network, a quality of the Hall measurements; and
calculating the first carrier mobility, the second carrier mobility and the photocarrier density based on the certain measure of quality of the Hall measurements.

14. The method of claim 12, wherein the determining comprises:
calculating a slope for a change in a Hall coefficient over a change in conductivity from the Hall measurements; and
calculating the first carrier mobility, the second carrier mobility and the photocarrier density based on the slope of change in a Hall coefficient over a change in conductivity.

15. A computer program product that facilitates Hall measurements, the computer program product comprising a non-transitory computer readable medium having program instructions embodied therewith, the program instructions are executable by a processor to cause the processor to:
illuminate a sample under test provided in a measurement chamber;
modulate the illumination of the sample under test, wherein the modulating the illumination of the sample under test comprises oscillating a light intensity of the illumination around a selected light intensity; and
determine at least a carrier mobility based on the Hall measurements and the modulated illumination.

16. The computer program product of claim 15, wherein the modulation of the illumination of the sample under test further comprises modulation of an intensity of the illumination from a first intensity to a second intensity.

17. The computer program product of claim 15, wherein the measurement of Hall measurements comprises measurement of conductivity of the sample under test as a function of the intensity of the illumination.

18. The computer program product of claim 15, wherein the measurement of Hall measurements further comprises measurement of a Hall coefficient of the sample under test as a function of the intensity of the illumination.

19. The computer program product of claim 15, wherein the program instructions are further executable by the processor to cause the processor to modulate an intensity of the illumination from a first intensity to a second intensity.

20. The computer program product of claim 15, wherein the program instructions are further executable by the processor to cause the processor to measure a conductivity and a Hall coefficient of the sample under test as a function of the intensity of the illumination.

* * * * *